US006812800B2

(12) United States Patent
Matsuura et al.

(10) Patent No.: US 6,812,800 B2
(45) Date of Patent: Nov. 2, 2004

(54) ATOMIC OSCILLATOR

(75) Inventors: Hideyuki Matsuura, Sapporo (JP); Ken Atsumi, Sapporo (JP); Yoshito Koyama, Kawasaki (JP); Minoru Sakai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/256,740

(22) Filed: Sep. 27, 2002

(65) Prior Publication Data

US 2003/0146796 A1 Aug. 7, 2003

(30) Foreign Application Priority Data

Feb. 5, 2002 (JP) ....................................... 2002-028283

(51) Int. Cl.[7] .................................................. H03L 7/26

(52) U.S. Cl. .......................... 331/94.1; 331/3; 332/227; 332/238; 332/246

(58) Field of Search .................... 331/3, 94.1; 333/227, 333/238, 246; 372/32

(56) References Cited

U.S. PATENT DOCUMENTS

| | | | | |
|---|---|---|---|---|
| 5,192,921 A | | 3/1993 | Chantry et al. | |
| 5,327,105 A | | 7/1994 | Liberman et al. | |
| 6,605,454 B2 | * | 8/2003 | Barenburg et al. ....... | 435/173.7 |

* cited by examiner

*Primary Examiner*—Arnold Kinkead
(74) *Attorney, Agent, or Firm*—Katten Muchin Zavis Rosenman

(57) ABSTRACT

In an atomic oscillator of an optical pumping system, a slot line resonator, as a microwave resonator, is arranged in a portion where atoms are excited. The slot line resonator forms a microstrip line inputting microwaves so as to be orthogonal to a slot line with a dielectric substrate being sandwiched therebetween. A container in which the atoms are enclosed is mounted on the slot line resonator, and the slot line resonator and the container are covered with a metallic case having a pumping light passage hole and a photo element.

10 Claims, 7 Drawing Sheets

ATOMIC OSCILLATOR

BACKGROUND OF THE INVENTION

1. Field of the Invention

The present invention relates to an atomic oscillator, and in particular to a passive-type atomic oscillator of an optical pumping system.

Recently, digital networking of information has been advanced, whereby a clock source with high accuracy/high stability becomes indispensable. While an atomic oscillator such as a rubidium atomic oscillator draws attention as the clock source, downsizing/slimming is expected for mounting form on a system.

2. Description of the Related Art

FIG. 7 schematically shows a rubidium atomic oscillator having a light-microwave resonator as known in the prior art.

This atomic oscillator is composed of a pumping light source 16, a cylindrical cavity resonator 40 having light passage holes (apertures) 15*a* and 15*b* for receiving a pumping light from the light source 16, a doughnut-shaped dielectric 41 contained in the resonator for downsizing the cavity resonator 40, a gas cell 42 for enclosing rubidium atoms further contained in the dielectric 41, a light detector 14 for detecting the pumping light passing through the gas cell 42, a frequency control circuit 17 for detecting the output of the light detector 14 and for obtaining a fixed frequency, an antenna 43 for inputting a microwave from the frequency control circuit 17 and for exiting the microwave within the cavity resonator 40, a tuning screw 44 for tuning the resonance frequency of the cavity resonator 40 to the resonance frequency of the rubidium atom, a temperature control circuit 19 for keeping a temperature fixed by detecting the temperature of the gas cell 42 with a thermal element 21 such as a thermistor and by controlling a current which flows through a heater resistor 18, and a transistor 20 controlled by the temperature control circuit 19.

In operation, when the microwave cavity resonator 40 is excited with 6834.682 . . . MHz that is the resonance frequency of the rubidium atom from the frequency control circuit 17 through the antenna 43, the rubidium atoms within the gas cell 42 absorb the light received from the pumping light source 16. This phenomenon can be confirmed by the output decrease of the light detector 14.

Accordingly, the frequency control circuit 17 controls the above-mentioned microwave frequency excited by the microwave cavity resonator 40 to the microwave frequency by which the output of the light detector 14 decreases, whereby an output signal of a frequency with high stability synchronized with the resonance frequency of the rubidium atom can be obtained.

In such a prior art example, the cavity resonator 40 easily available has been used since the dielectric 41 containing the gas cell 42 is required to be provided within the resonator 40. In order to realize downsizing the cavity resonator 40, various attempts have been made, and devices such as a change of an accessible resonance mode and a high dielectric material charge have been performed.

In the prior art example shown in FIG. 7, by using a basic mode of the cylindrical cavity resonator $TE_{111}$, and by having a built-in alumina ceramic dielectric 41, the cavity resonator 40 of 16 mm in diameter and 25 mm in length is realized. By utilizing this cavity resonator 40, a rubidium atomic oscillator of 23 mm (95 cc) in thickness (height) is on the market.

However, the market demands further downsizing and cost-reduction. It is difficult for the atomic oscillator using the prior art cavity resonator as mentioned above to meet the market demands as follows:

In order to meet the market demands, a microwave resonator which is substituted for the cavity resonator requiring a large space is necessary. As one example, a rubidium atomic oscillator (18 mm in thickness) using "half coaxial resonator" has begun to be offered from foreign manufacturers.

However, since a mechanism accuracy of this half coaxial resonator directly influences the resonance frequency, it is natural that a frequency adjustment mechanism should be added. For this reason, the structure of the mechanism becomes complicated and the price becomes expensive.

Also, the adjustment of the resonance frequency is necessary, and the cost increases in proportion to adjustment man-hours etc. Furthermore, in order to excite the resonator, a mechanical antenna or a probe becomes necessary, so that the mechanism becomes complicated even in this point, which causes a cost increase.

SUMMARY OF THE INVENTION

It is accordingly an object of the present invention to provide an inexpensive atomic oscillator of an optical pumping system, enabling downsizing, and excluding resonance frequency adjustments, antenna, and probe.

FIG. 1 is a diagram showing an electromagnetic field distribution in a well-known slot line. A metal conductor 2 is formed (metallized) on a high dielectric substrate 1. If the metal conductor 2 is peeled (removed) by a certain slit to form a slot line 3, electric fields concentrate on the edge of the metal conductor 2 of the ground potential so that a transmission line is formed. The electromagnetic field distribution forms a magnetic field line 4 and an electric field line 5, which forms a mode similar to a basic mode of a square waveguide, $TE_{10}$.

On the other hand, a microstrip line is frequently used in a circuit of a microwave band. This is because a line section structure is simple, and also, since the ground conductor is arranged on the backside of the dielectric in which much of the electromagnetic field is distributed inside, a distribution characteristic becomes small, a passage loss is little, and a crosstalk or the like is relatively little so that the integration is easy.

A microwave resonator using such a microstrip line has been already realized. However, since it is characterized in that the magnetic field does not influence the outside as mentioned above, the application thereof to the atomic oscillator is difficult.

On the contrary, the electromagnetic field of the slot line is distributed in a wide area as mentioned above, and has a feature that the dispersion characteristic is large. This means that the passage loss is large, and unnecessary coupling of a crosstalk or the like is required to be prevented, so that it is difficult to use the slot line for a transmission line.

However, from another viewpoint, "applications of atomic oscillator to microwave resonator", there are found many advantages in the slot line as follows:

① "Dispersion characteristic is large"→Magnetic coupling with atoms is easy.

② "TE wave"→Since only the distribution of the magnetic field exists along a line axis (direction of propagation), it becomes possible to widely secure an optical pumping area.

③ "Making MMIC (or MMICization) is easy"→Since a resonance frequency is basically determined by the length of the slot line, it is possible to make the resonance frequency adjustment-free.

④ "Coupling with a different kind of line is easy"→Since coupling with a microstrip line or the like is easy, MMICization including an input/output coupling circuit can be easily realized.

In the present invention, a resonator using a slot line as a microwave resonator is arranged in the portion where atoms are excited, thereby enabling an atomic oscillator downsized/slimmed, and low-cost, not requiring a resonance frequency adjustment to be realized.

FIG. 2 shows an arrangement of a resonator using a slot line. In this slot line resonator 10, an upper surface of the dielectric substrate 1 is preferably metallized with the metal conductor 2. The surface of the metal conductor 2 is peeled to form the slot line 3 of e.g. "W" in width and $\lambda_s/2$ in length. It is to be noted that $\lambda_s$ indicates 1 wavelength corresponding to a resonance frequency 6834.682 . . . MHz of e.g. the rubidium atom calculated from an rms dielectric constant on the slot line.

Also, a microstrip line 6 passing through the center of the slot line 3 and forming an open edge at a distance of e.g. $\lambda_m/4$ from the slot line 3 is provided on the backside of the dielectric substrate 1 so as to be orthogonal to each other. It is to be noted that $\lambda_m$ indicates 1 wavelength corresponding to a resonance frequency 6834.682 . . . MHz of e.g. the rubidium atom calculated from the rms dielectric constant on the microstrip line 6.

If a microwave is inputted from the microstrip line 6, coupling of the electromagnetic field arises at a cross junction (intersection) between the microstrip line 6 and the slot line 3, and the microwave having propagated through the microstrip line 6 is now propagated to the slot line 3.

This electromagnetic field coupling is adapted to have a preferable size so as to perform an efficient coupling at 6834.682 . . . MHz that is the resonance frequency of the rubidium atom, and the slot line 3 is set to resonate with the frequency. The electromagnetic field distribution at this resonance assumes the magnetic field line 4 and the electric field line 5 as shown in FIG. 3.

Thus, it is possible to make the structure of the slot line resonator 10 slimmed, almost dependent on the thickness of the dielectric 1.

A container (gas cell) in which the atoms are enclosed is mounted on the slot line resonator 10. The slot line resonator 10 and the container are covered with a metallic case having a pumping light passage hole and a photo element, thereby enabling a slimmed atomic oscillator to be obtained.

Also, a container made of the same material as the above-mentioned dielectric substrate 1, having a pumping light passage hole, and enclosing therein the atoms may be formed with the slot line resonator 10 in one unit.

Also, the above-mentioned microstrip line may be provided on a backside of the container or on another printed board, and the slot line resonator is formed of the microstrip line and the slot line by mounting the container on the printed board.

Furthermore, it is preferable that the inside of the above-mentioned container is metallized with a metal conductor, a glass coating is applied to the surface, and a chemical reaction between an electromagnetic wave shield and the atoms is suppressed.

Furthermore, a glass container whose outer surface except the above-mentioned slot line and a pumping light passage hole is metallized with a metal conductor may be mounted on a printed board, and the microstrip line may be formed on a backside of the printed board.

A heater resistor for heating may be patterned around the above-mentioned metallized container.

The above-mentioned dielectric may comprise e.g. alumina ceramic.

For the above-mentioned atom, rubidium or cesium may be used.

BRIEF DESCRIPTION OF THE DRAWINGS

The above and other objects and advantages of the invention will be apparent upon consideration of the following detailed description, taken in conjunction with the accompanying drawings, in which the reference numbers refer to like parts throughout and in which.

DESCRIPTION OF THE EMBODIMENTS

Figure 4A:
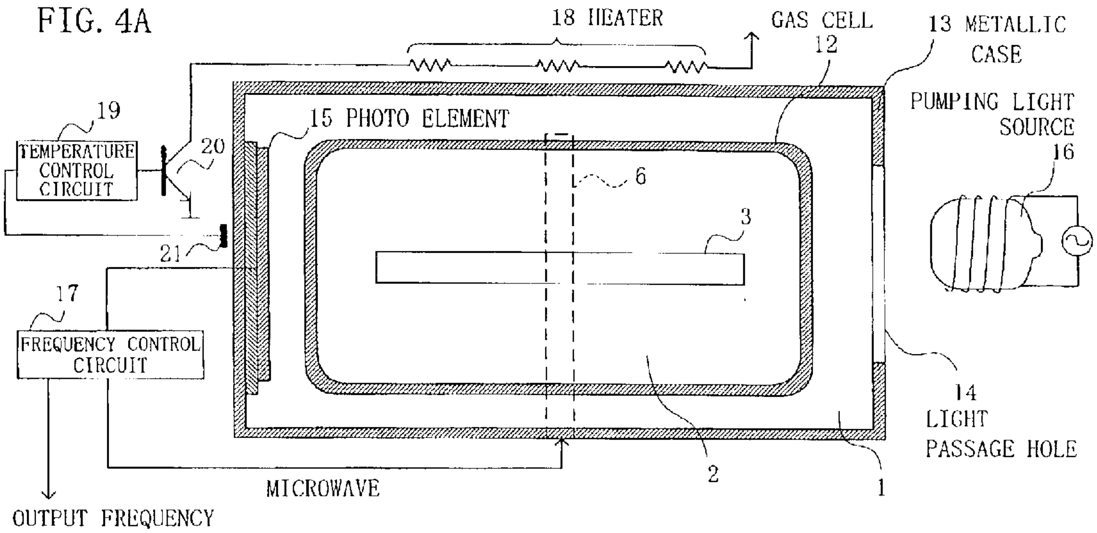
FIGS. 4A–4C are views showing an embodiment (1) of an atomic oscillator according to the present invention.
Figure 4B:
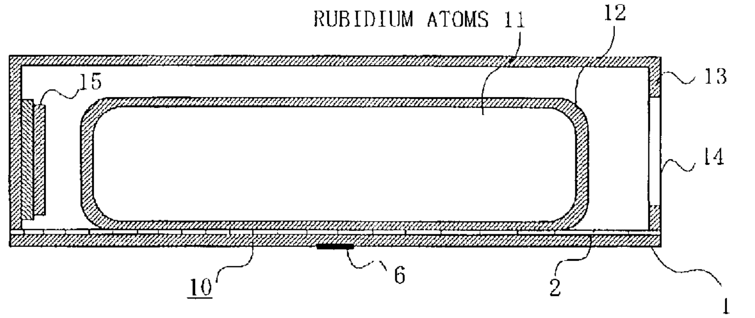
Figure 4C:
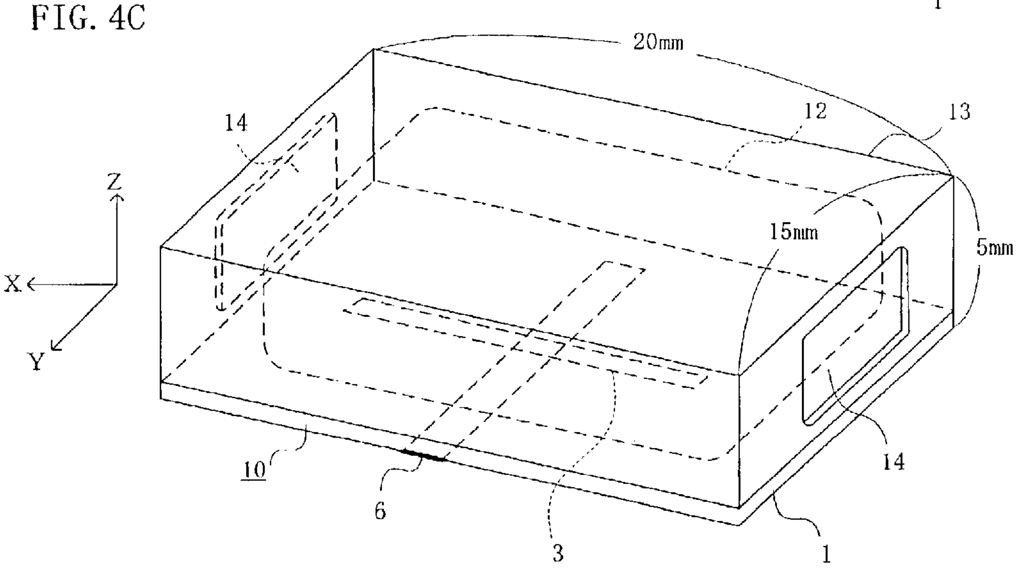

FIGS. 4A–4C show an embodiment (1) of an atomic oscillator according to the present invention, in which FIG. 4C shows a perspective view, FIG. 4A shows a sectional view as cut along X-Y plane in FIG. 4C, and FIG. 4B shows a sectional view as cut along X-Z plane in FIG. 4C.

Figure 1:
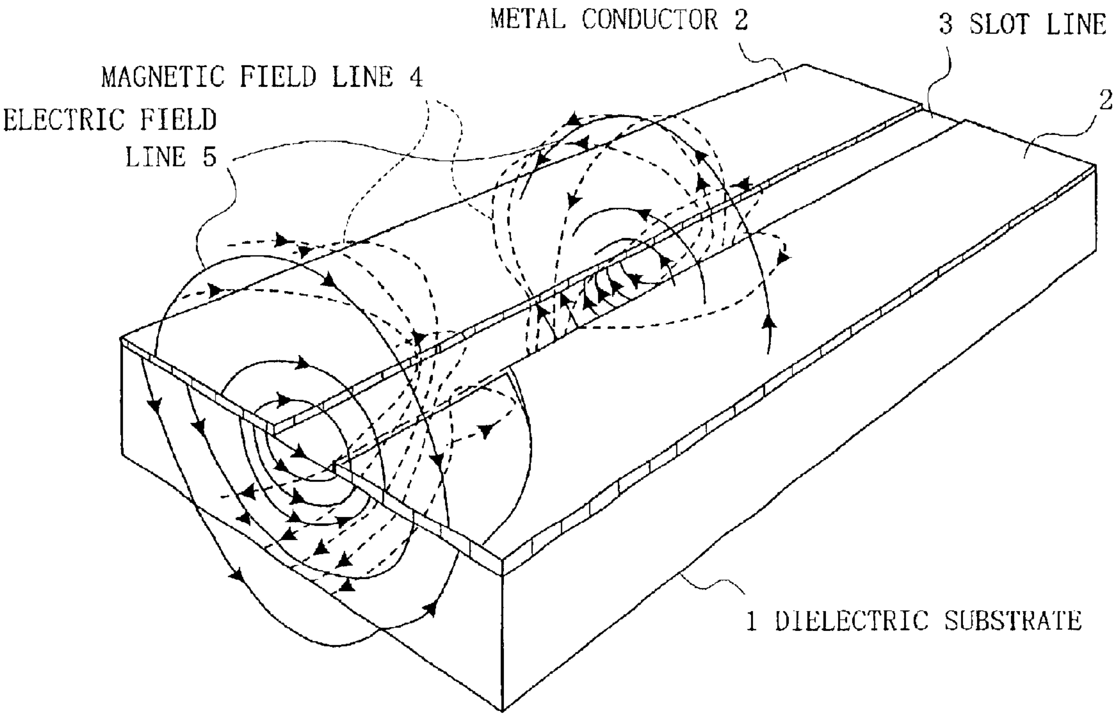
FIG. 1 is a perspective view showing a principle of a slot line used for an atomic oscillator according to the present invention.
Figure 2:
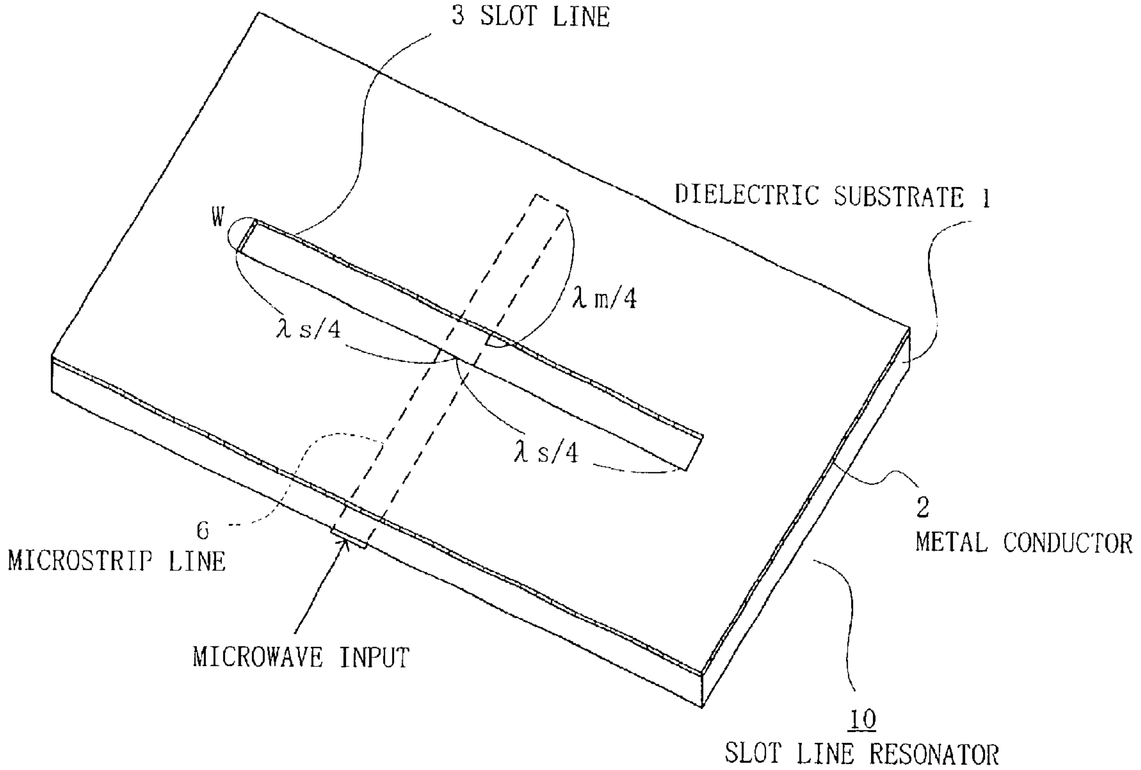
FIG. 2 is a perspective view showing an arrangement of a slot line resonator used for an atomic oscillator according to the present invention.
Figure 3:
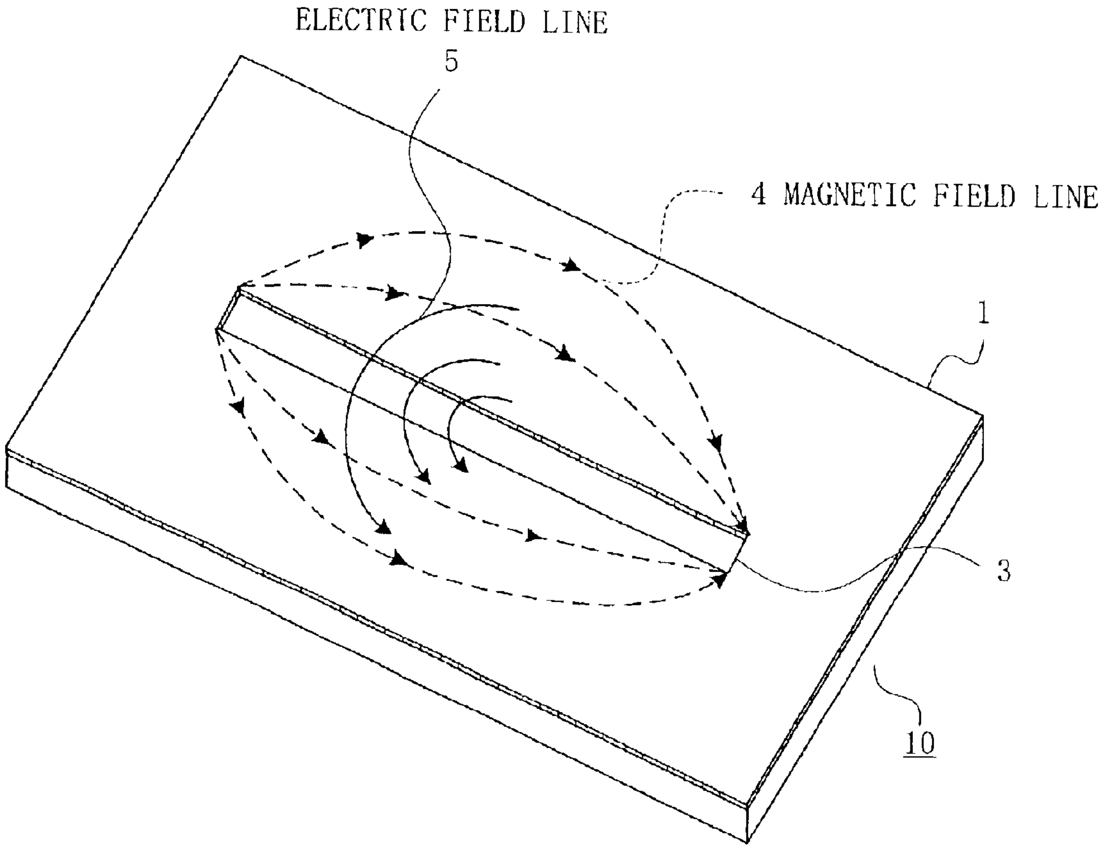
FIG. 3 is a perspective view showing an electromagnetic field distribution upon resonance of a slot line resonator used for an atomic oscillator according to the present invention.

In this embodiment, as having been shown in FIG. 2, a cross junction is formed with the slot line 3 and the microstrip line 6, connected to an external coupling circuit, on both sides of the dielectric substrate 1, which is easily formed by a conventionally well-known photo etching technique.

A gas cell 12 that is a light-permeable container in which rubidium atoms 11 are enclosed is mounted, as shown in FIGS. 4A–4C, in an area where a resonant magnetic field of the slot line resonator 10 is distributed. While this embodiment has a form that the gas cell 12 is placed on the slot line 3 is adopted considering a tight coupling with the magnetic field, if this coupling with the magnetic field is close enough, the gas cell 12 may be levitated from the metal conductor 2 forming the slot line 3. In this case, it is natural that the slot line 3 is set in view of a dielectric constant of a glass forming the gas cell 12.

The slot line resonator 10 and the gas cell 12 are covered with a metallic case 13, thereby preventing an incidence of an unnecessary light, and influences from an unnecessary radio wave and an external magnetism.

For this metallic case 13, a light passage hole 14 for receiving a pumping light from a pumping light source 16 is provided and a photo element 15 for monitoring its light intensity is attached. The output of the photo element 15 is provided to a frequency control circuit 17, and a microwave is provided to the microstrip line 6 from the frequency control circuit 17 to execute the resonance frequency control similar to the prior art in FIG. 7.

Furthermore, in order to heat the gas cell 12, and to control the temperature to be fixed by a thermistor 21, a temperature control circuit 19 is provided and controls a transistor 20, whereby current of a surface heating sheet 18 or a heater resistor is controlled.

As a heating circuit of the temperature control circuit 19, the surface heating sheet 18 may be directly adhered on the metallic case 13, or may heat the dielectric substrate 1. In either case, if a connection land is provided on the dielectric substrate, the heating circuit can be easily added.

It is to be noted that although being not shown in FIGS. 4A–4C, a magnetostatic application circuit is provided for clearly separating transition energy bands of the rubidium atom. This magnetostatic application circuit is well known for applying a magnetostatic field in parallel with the magnetic field made by the slot line resonator 10 in order to obtain a hyperfine structure (σ transition) of the rubidium atom by the magnetic field.

Thus, by the present invention, the microwave resonator can be patterned on the dielectric substrate by the photo etching technique. Namely, compared with the prior art resonator depending on mechanical parts, a substantially slimmed resonator can be realized. Accordingly, compared with the prior art example, slimmed products can be commercially offered.

However, in the above-mentioned embodiment, a glass thickness of a glass container forming the gas cell 12 constitutes an increasing proportion of a factor for determining the thickness of the product.

Figure 5A:
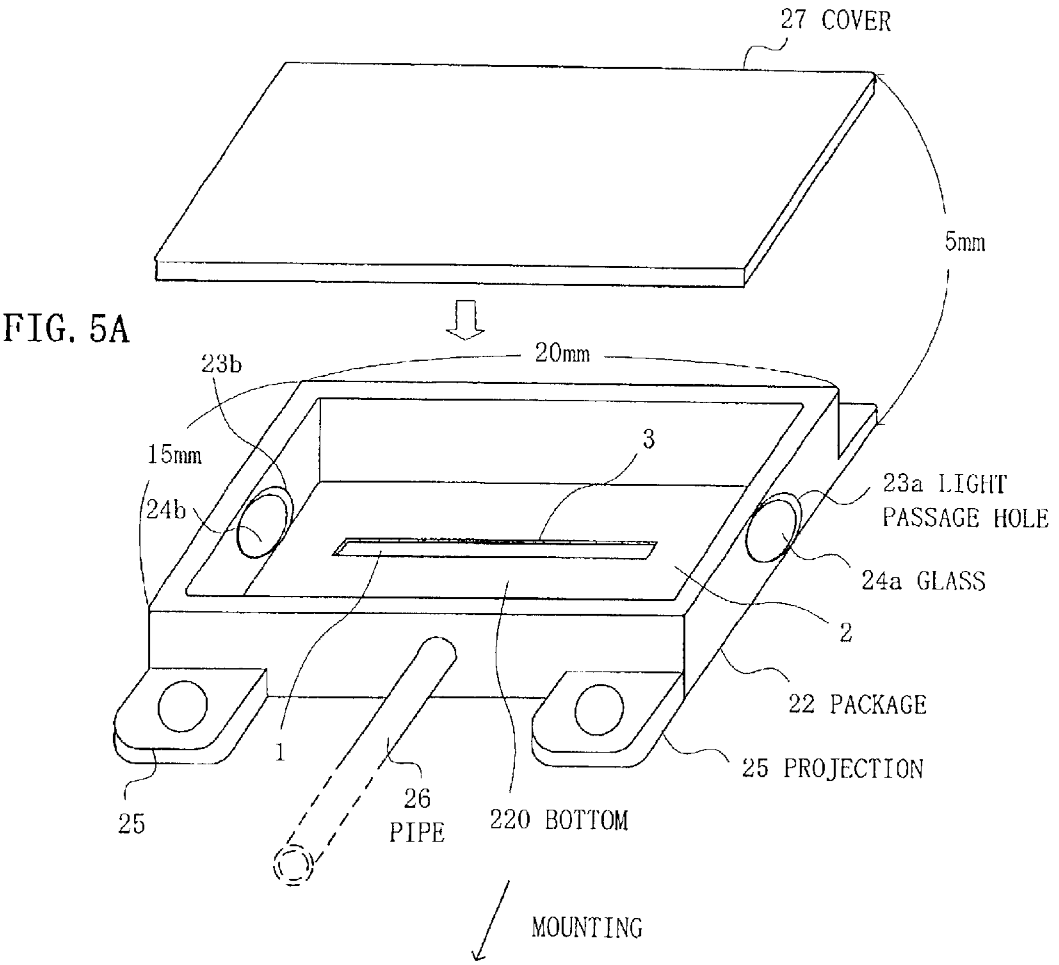
FIGS. 5A and 5B are views showing an embodiment (2) of an atomic oscillator according to the present invention.
Figure 5B:
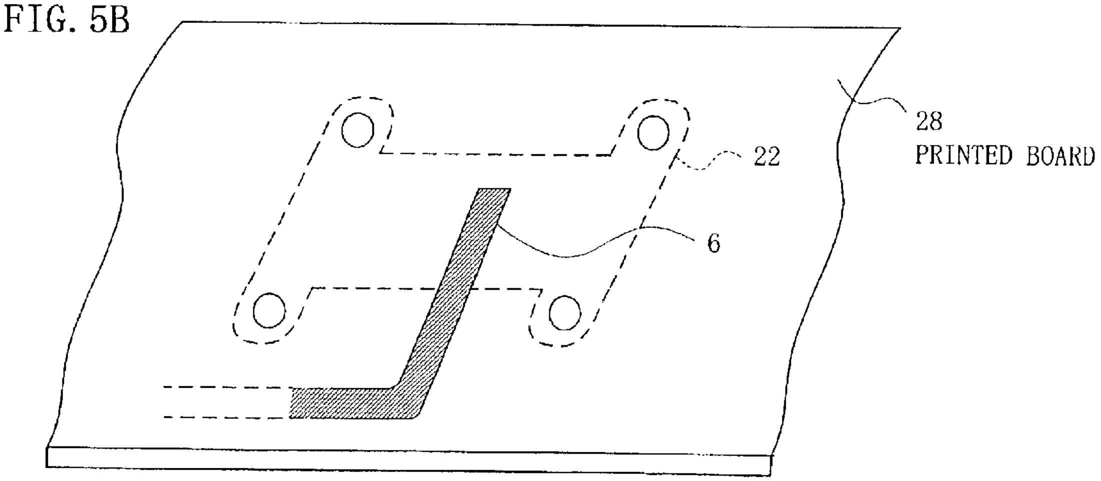

Therefore, the embodiment (2) shown in FIGS. 5A and 5B has eliminated the gas cell as mentioned above.

Namely, as shown in FIG. 5A, a hole 23*a* for receiving the pumping light and a monitoring hole 23*b* are provided for a package 22 using alumina ceramic. Glasses 24*a* and 24*b* respectively fuse with these holes 23*a* and 23*b*. For these glasses 24*a* and 24*b*, Kovar glass whose thermal expansion coefficient is the same degree as that of alumina ceramic is suitable.

The package 22 except the backside of a bottom 220 (bottom surface contacting a printed board 28 shown in FIG. 5B) is metallized with the metal conductor. The slot line 3 is provided within the metal conductor 2 on a top surface of the bottom 220, so that a resonator resonating with a resonance frequency of the rubidium is formed.

Also, a fixing mechanism is provided for the package 22 to be mounted on the printed board 28. In FIG. 5A, for the assumption of screwing, projections 25 each having a screw hole are provided at four corners. When the mounting is performed by soldering, a solder lead has only to be provided.

Also, a pipe 26 is provided for the package 22, and is used upon introducing a rubidium gas.

The package 22 is covered with a cover 27 to enclose the inside thereof. This cover 27 is made of alumina ceramic metallized with the metal conductor. This is for the sake of adjusting the expansion coefficient of the cover 27 to that of the material of the package 22, and of providing a conductivity for measures against EMI.

After a glass coating is applied to the insides of the package 22 and the cover 27, both are stuck by glass fusing. The reason why the glass coating is applied to the inside is to suppress a chemical reaction of the material, alumina ceramic, gold, or the like and the rubidium atom.

Then, the rubidium gas is introduced from the pipe 26, and then the pipe 26 is sealed.

Figure 7:
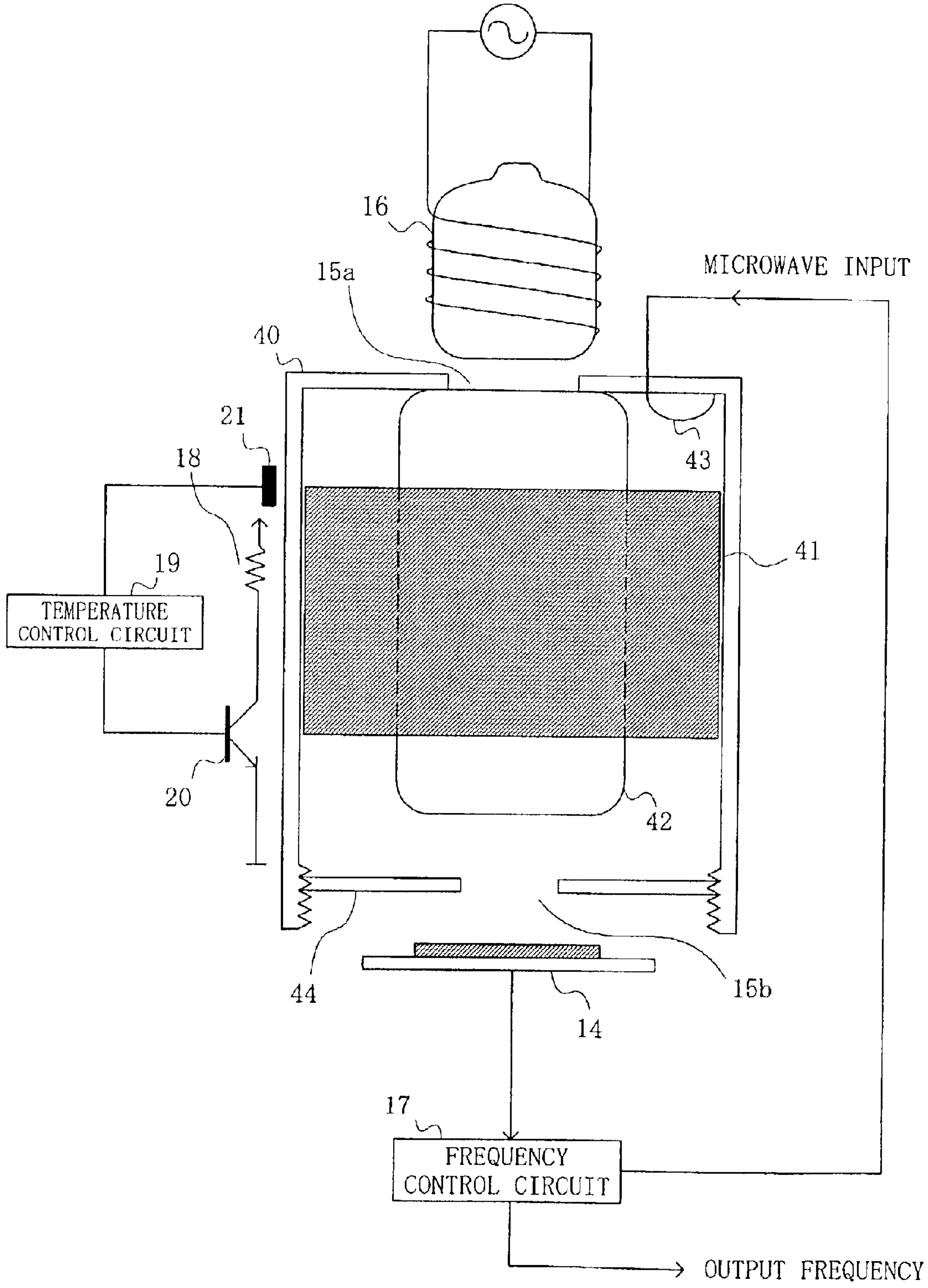
FIG. 7 PRIOR ART
FIG. 7 is a view showing a prior art example.

The sealed pipe corresponds to the prior art "gas cell" shown in FIG. 7, which is mounted on the printed board 28.

At this time, the microstrip line 6 that is a coupling circuit for a microwave excitation is preliminarily formed at the position (shown by dotted lines) corresponding to the backside of the package 22 on the printed board 28. Since the bottom of the package 22 is not metallized with the metal conductor, the cross junction portion with the microstrip line 6 is formed through the dielectric substrate 1, thereby enabling the microwave excitation to the package inside.

It is to be noted that while in the embodiment of FIGS. 5A and 5B, the microstrip line 6 (see FIG. 5B) and the slot line 3 (see FIG. 5A) are respectively formed on different substrates, it is also possible to form the microstrip line 6 on the bottom of the package 22.

Further, it will be made possible to use the metallized portion of the outer surface of the package 22 as a circuit pattern. For example, if a resistor is printed, it is easily realized to add a function as a heater connected to the temperature control circuit 19 shown in FIG. 4A.

Figure 6A:
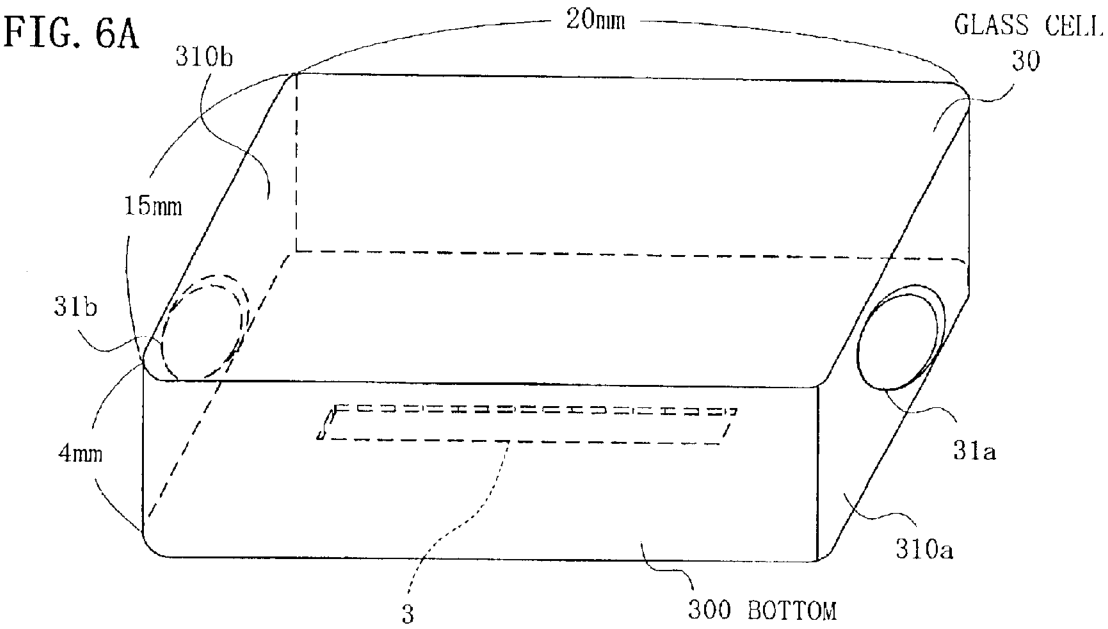
FIGS. 6A and 6B are views showing an embodiment (3) of an atomic oscillator according to the present invention.
Figure 6B:
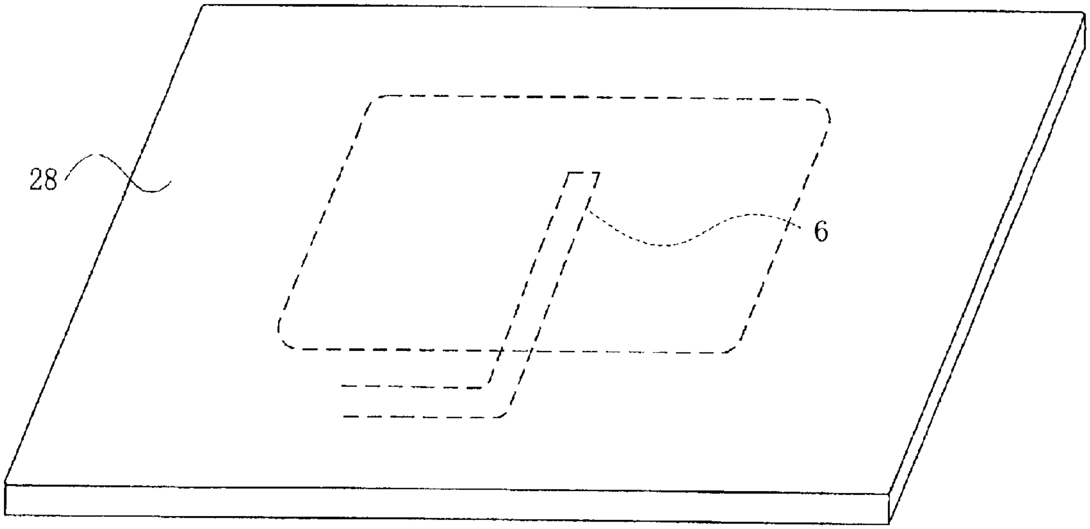

FIGS. 6A and 6B show further embodiment (3) of the present invention. In this embodiment, all of the outer surface of a glass cell 30 is metallized with the metal conductor, a portion for the slot line 3 is peeled on the backside of a bottom 300, and the metal conductor is peeled from only light passage holes 31*a* and 31*b* on sides 310*a* and 310*b*.

If only the glass cell 30 is mounted on the printed board 28 as shown by the dotted lines after the strip line 6 is formed, as shown in FIG. 6B, on the backside of the printed board 28, the inside of the glass cell 30 can be excited by the microwave.

It is needless to say that the pumping light source 16, the photo element 15, the frequency control circuit 17, the temperature control circuit 19, and the thermal element are provided on the outside of the package 22 in the above-mentioned embodiments (2) and (3).

As described above, an atomic oscillator according to the present invention is arranged such that a slot line resonator, as a microwave resonator, is arranged in a portion where atoms are excited. Therefore, the microwave resonator can be easily realized by a patterning on a substrate. This indicates that a "slimmed resonator" can be realized.

Also, the resonance frequency of this slot line resonator is determined by a slot line length by the patterning. Therefore, if variations in the rms dielectric constant of the slot line are suppressed, a desired resonance frequency adjustment-free is obtained.

As an example of a size for obtaining a resonance at a band of 6834 GHz that is the resonance frequency of the rubidium atom, when a resinous substrate material (relative dielectric constant $\epsilon_r$=3.6) is used, the slot length in the vicinity of 16 mm can be realized; When alumina ceramic ($\epsilon_r$=9.5) is used, the slot length in the vicinity of 12 mm can be realized.

Also, in order to obtain the resonance at a band of 9192 MHz that is the resonance frequency of the cesium atom, when the resinous substrate material ($\epsilon_r$=3.6) is used, the slot line length in the vicinity of 12 mm can be realized; When alumina ceramic ($\epsilon_r$=9.5) is used, the slot line length in the vicinity of 9 mm can be realized. Thus, downsizing is made possible.

Accordingly, in the above-mentioned embodiments (1) and (2), the size of the metallic case 13 or the package 22 can be confined to only 20×15×5 mm, and the size of glass cell 30 in the embodiment (3) can be confined to only 20×15×4 mm. Thus, it is found that the size is greatly slimmed especially in terms of thickness (height) compared with the cavity resonator shown in FIG. 7.

Furthermore, the slot line resonator of the present invention can be easily coupled with different kind of lines such as a microstrip line, and an input/output coupling circuit can be performed by a pattern design, which contributes to a cost reduction of a device.

What we claim is:

1. An atomic oscillator of an optical pumping system comprising:

a portion where atoms are excited; and a slot line resonator, as a microwave resonator, arranged in the portion, wherein the slot line resonator forms a microstrip line inputting microwaves so as to be orthogonal to a slot line with a dielectric substrate being sandwiched therebetween.

2. The atomic oscillator as claimed in claim 1 wherein a container in which the atoms are enclosed is mounted on the slot line resonator, and the slot line resonator and the container are covered with a metallic case having a pumping light passage hole and a photo element.

3. The atomic oscillator as claimed in claim 1 wherein a container made of a same material as the dielectric substrate, having a pumping light passage hole, and enclosing therein the atoms is formed with the slot line resonator in one unit.

4. The atomic oscillator as claimed in claim 3 wherein the microstrip line is provided on a backside of the container or on another printed board, and the slot line resonator is formed of the microstrip line and the slot line by mounting the container on the printed board.

5. The atomic oscillator as claimed in claim 4 wherein an inside of the container is metallized with a metal conductor, and a glass coating is further applied thereto.

6. The atomic oscillator as claimed in claim 1 wherein a glass container whose outer surface except the slot line and a pumping light passage hole is metallized with a metal conductor is mounted on a printed board, and the microstrip line is formed on a backside of the printed board.

7. The atomic oscillator as claimed in claim 6 wherein a heater resistor for heating is patterned around the container.

8. The atomic oscillator as claimed in claim 1 wherein the dielectric comprises alumina ceramic.

9. The atomic oscillator as claimed in claim 1 wherein the atoms comprise rubidium.

10. The atomic oscillator as claimed in claim 1 wherein the atoms comprise cesium.

* * * * *